United States Patent
Uesugi et al.

(10) Patent No.: US 7,660,082 B2
(45) Date of Patent: Feb. 9, 2010

(54) TMR ELEMENT HAVING A TUNNEL BARRIER WHICH INCLUDES CRYSTALLINE PORTIONS AND NON-CRYSTALLINE PORTIONS

(75) Inventors: Takumi Uesugi, Tokyo (JP); Satoshi Miura, Tokyo (JP); Takeo Kagami, Tokyo (JP)

(73) Assignee: TDK Corporation, Tokyo (JP)

( * ) Notice: Subject to any disclaimer, the term of this patent is extended or adjusted under 35 U.S.C. 154(b) by 659 days.

(21) Appl. No.: 11/500,379

(22) Filed: Aug. 8, 2006

(65) Prior Publication Data

US 2007/0053114 A1    Mar. 8, 2007

(30) Foreign Application Priority Data

Aug. 10, 2005  (JP)  .............................. 2005-232302

(51) Int. Cl.
G11B 5/39 (2006.01)
G11C 11/14 (2006.01)

(52) U.S. Cl. ...................... 360/324.2; 365/158; 365/171

(58) Field of Classification Search .............. 360/324.2; 365/145, 158, 171–173; 257/421–427; 428/810–816
See application file for complete search history.

(56) References Cited

U.S. PATENT DOCUMENTS 5,585,196 A * 12/1996 Inomata et al. .......... 428/811.3
7,443,639 B2 * 10/2008 Parkin ..................... 360/324.2

OTHER PUBLICATIONS

K. Tsunekawa, et al., "CoFeB/MgO/CoFeB/Magnetic Tunnel Junctions with High TMR and Low Junction Resistance", Proceedings of INTERMAG 2005, Apr. 4, 2005.
http://www.jpo.go.jp/shiryou/index.htm, "Other information> standard technology> electricity> 2004 fiscal year> MRAM and spin memory technology (sections 1-2-2-3 to 1-2-2-6)" updated Mar. 25, 2005 by Japan Patent Office.

* cited by examiner

*Primary Examiner*—A. J. Heinz
(74) *Attorney, Agent, or Firm*—McGinn IP Law Group, PLLC

(57) ABSTRACT

A magneto-resistive element has a lower layer, a tunnel barrier layer, and an upper layer. The lower layer, the tunnel barrier layer, and the upper layer are disposed adjacent to each other and are stacked in this order. A magnetization direction of either of the lower layer and the upper layer is fixed relative to an external magnetic field, and a magnetization direction of the other layer is variable in accordance with the external magnetic field. A crystalline portion and a non-crystalline portion co-exist in a plane that is parallel with a surface of the tunnel barrier layer.

8 Claims, 10 Drawing Sheets

PRIOR ART

Track Width Direction

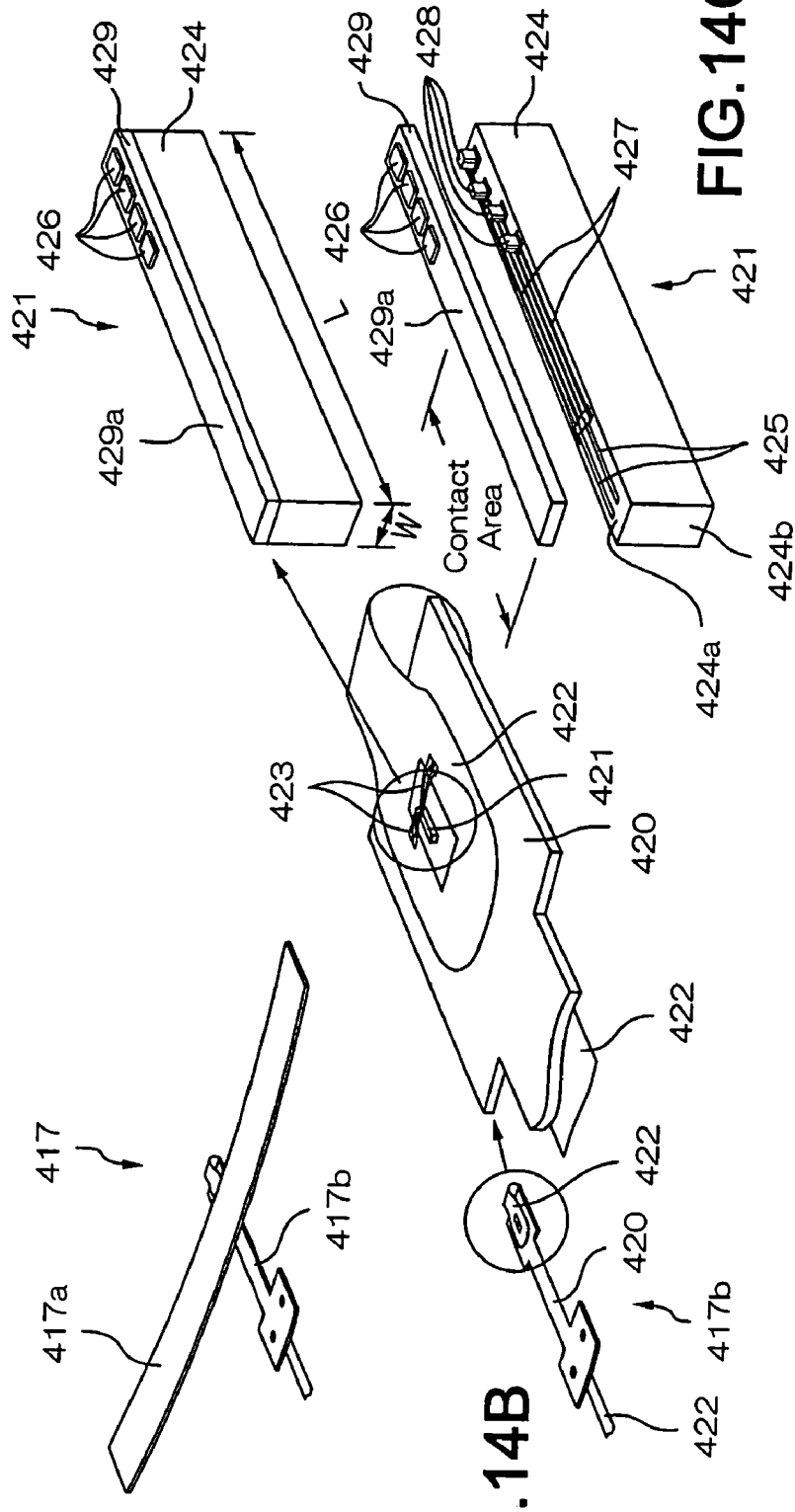

TMR ELEMENT HAVING A TUNNEL BARRIER WHICH INCLUDES CRYSTALLINE PORTIONS AND NON-CRYSTALLINE PORTIONS

The present application is based on, and claims priority from, J.P. Application No. 2005-232302, filed Aug. 10, 2005, the disclosure of which is hereby incorporated by reference herein in its entirety.

BACKGROUND OF THE INVENTION

1. Field of the Invention

The present invention relates to a magneto-resistive element and a method for manufacturing the same, particularly to the structure of a TMR element.

2. Description of the Related Art

Conventionally, a GMR (Giant Magneto-Resistive) element using a spin valve (SV) film has widely been used as a magneto-resistive element for a hard disk drive, and, in recent years, a TMR (Tunnel Magneto-Resistive) element is attracting attention as a highly sensitive magneto-resistive element. The TMR element is formed by stacking a lower magnetic layer, a tunnel barrier layer, and an upper magnetic layer in this order. In one embodiment, the lower magnetic layer has a magnetization direction that is fixed relative to the external magnetic field (this layer is also called a pinned layer), and the upper layer has a magnetization direction that is variable in accordance with the external magnetic field (this layer is also called a free layer). When sense current is applied in the direction of the stacking of the layers, electrons flow from the upper layer to the lower layer (or in the inverse direction) beyond the energy barrier that is established by the tunnel barrier layer. This effect is called the tunneling effect. It is known that the resistance to the sense current changes in accordance with the relative angle between the magnetization direction of the upper layer and the magnetization direction of the lower layer. The change in the resistance to the sense current, or MR ratio, can be detected when the magnetization direction of the upper layer changes in accordance with the external magnetic field.

A TMR element detects the magnitude of the external magnetic field in this way, and reads magnetic data in a recording medium. Since the reproduction output of the magneto-resistive element depends on the MR ratio, and since a TMR element exhibits a significantly larger MR ratio than a conventional GMR element, a TMR element is advantageous for providing a high-power magneto-resistive element.

The tunnel barrier layer is usually made of non-magnetic and non-conductive materials, such as alumina, and it is known that a TMR element using magnesium oxide (MgO) as the tunnel barrier also exhibits a large MR ratio. In particular, it is known that MgO having a crystalline structure of {100} orientation exhibits a large MR ratio. Therefore, the MgO layer is typically annealed at a high temperature in order to obtain such a crystalline structure.

In K. Tsunekawa et al, "CoFeB/MgO/CoFeB/Magnetic Tunnel Junctions with High TMR and Low Junction Resistance", Proceedings of INTERMAG 2005, Apr. 4, 2005, an exemplary TMR element that uses MgO as the tunnel barrier layer is disclosed. Similar information is found at http://www.jpo.go.jp/shiryou/index.htm (searched on 27 Jul., 2005) "Other information>standard technology>electricity>2004 fiscal year>MRAM and spin memory technology (Sections 1-2-2-3 to 1-2-2-6)" updated on Mar. 25, 2005 by Japan Patent Office, which discloses a layer arrangement in which the tunnel barrier made of MgO is sandwiched by CoFeB layers. Further, in INTERMAG 2005, held on 4 to 8 Apr., 2005, a study result was reported, in which the MR ratio significantly worsens for a tunnel barrier layer with a thickness that is less than a certain value. According to the report, the reason is that MgO is not crystallized in the initial state of forming MgO layer on the CoFeB layer, and that when the MgO layer reaches a certain thickness, a crystalline portion, which improves the MR ratio, is formed on the CoFeB layer.

As described above, it has been conventionally considered that a tunnel barrier layer in which a crystalline structure is dominant is effective for enhancing the MR ratio of a TMR element having a tunnel barrier layer that is made of MgO. However, the inventors discovered that the MR ratio is not always improved even if the crystalline structure of MgO is dominant. The inventors think that one of the reasons is in-plane stress in the tunnel barrier layer that is caused by other layers which are stacked together with the tunnel barrier layer.

FIG. 1 schematically shows the structure of a tunnel barrier layer. A TMR element, which is also used for a magnetic sensor and a magnetic memory element (MRAM, Magnetic Random Access Memory) in addition to the magneto-resistive element for the hard disk drive, as described above, generally has layers other than the tunnel barrier layer, the upper layer, and the lower layer regardless of the products to which a TMR element is applied. Taking a magnetic head as an example, a write head portion, not shown, is disposed on the upper layer (free layer), and an overcoat layer made of alumina or the like, not shown, is disposed on the write head portion. Various stresses are caused during the formation of these layers. In particular, formation of the overcoat layer generally causes compressive stress, which causes in-plane tensile stress in tunnel barrier layer 108. The tensile stress works to increase the distance between atoms in tunnel barrier layer 108, as indicated by the arrow in FIG. 1.

In general, it is thought that such stresses are caused at the interfaces between layers, and cooperate to generate a complicated stress state. In particular, the accumulation of such stresses and the resultant small cracks in tunnel barrier layer 108 may lead to the disadvantage that a leak path is generated for the sense current to intensively flow and thereby the MR ratio is reduced. Therefore, it is important to prevent in-plane stress in the tunnel barrier layer, as well as to crystallize the tunnel barrier layer, in order to improve the MR ratio.

SUMMARY OF THE INVENTION

It is an object of the present invention to provide a magneto-resistive element having an improved MR ratio by preventing in-plane stress in the tunnel barrier layer having a crystalline structure.

It is another object of the present invention to provide a method for manufacturing such a magneto-resistive element.

A magneto-resistive element comprises a lower layer, a tunnel barrier layer, and an upper layer. The lower layer, the tunnel barrier layer, and the upper layer are disposed adjacent to each other and are stacked in this order. A magnetization direction of either of the lower layer and the upper layer is fixed relative to an external magnetic field, and a magnetization direction of the other layer is variable in accordance with the external magnetic field. A crystalline portion and a non-crystalline portion co-exist in a plane that is parallel with a surface of the tunnel barrier layer.

The tunnel barrier layer, which is arranged between the upper layer and the lower layer, may suffer from in-plane tensile and compressive stress at the interfaces on the upper layer and on the lower layer. This stress is thought to be caused by the in-plane stress, which is generated during the formation of other layers that constitute the magneto-resistive element or during the formation of layers that are stacked together with the magneto-resistive element, and which is transmitted via the upper layer and the lower layer. If crystalline portion is continuously formed in the tunnel barrier layer, the tunnel barrier layer may be directly subject to these external stresses, and may suffer from large internal stress. However, in the present invention, since the tunnel barrier layer is formed such that crystalline portions and non-crystalline portions co-exist in a plane that is parallel with the surface of the tunnel barrier layer, the non-crystalline portions absorb the stress. Thus, the internal stress is localized and limited though the external stresses are similarly applied. Accordingly, large in-plane stress is prevented in the tunnel barrier layer, and the tunnel barrier becomes more resistive against damage due to the stress. Additionally, since the sense current flows between the lower layer and the upper layer via the crystalline portions, a sufficient tunneling effect can be ensured.

A method of manufacturing a magneto-resistive element regards a magneto-resistive element which comprises a lower layer, a tunnel barrier layer, and an upper layer, wherein a magnetization direction of either of the lower layer and the upper layer is fixed relative to an external magnetic field, and a magnetization direction of the other layer is variable in accordance with the external magnetic field. The method comprises the steps of: forming the lower layer; applying plasma treatment to an upper surface of the lower layer; stacking the tunnel barrier layer on the upper surface of the lower layer, wherein the plasma treatment has been applied to the upper surface of the lower layer; and forming the upper layer on an upper surface of the tunnel barrier layer.

As described above, according to the magneto-resistive element of the present invention, since the tunnel barrier layer includes crystalline portions and non-crystalline portions that co-exist in a plane that is parallel with the surface of the tunnel barrier layer, the in-plane stress in the tunnel barrier layer having a crystalline structure is limited, and small cracks are prevented, leading to improvement in the MR ratio. Further, the method for manufacturing the magneto-resistive element of the present invention enables the manufacturing of such a magneto-resistive element.

The above and other objects, features, and advantages of the present invention will become apparent from the following description with reference to the accompanying drawings which illustrates the present invention.

BRIEF DESCRIPTION OF THE DRAWINGS

FIG. 14A is a perspective view of a magnetic rotary encoder;

FIG. 14B is a perspective exploded view of a sensor assembly; and

FIG. 14C is a perspective exploded view of a magnetic sensor chip.

DETAILED DESCRIPTION OF THE INVENTION

Figure 1:
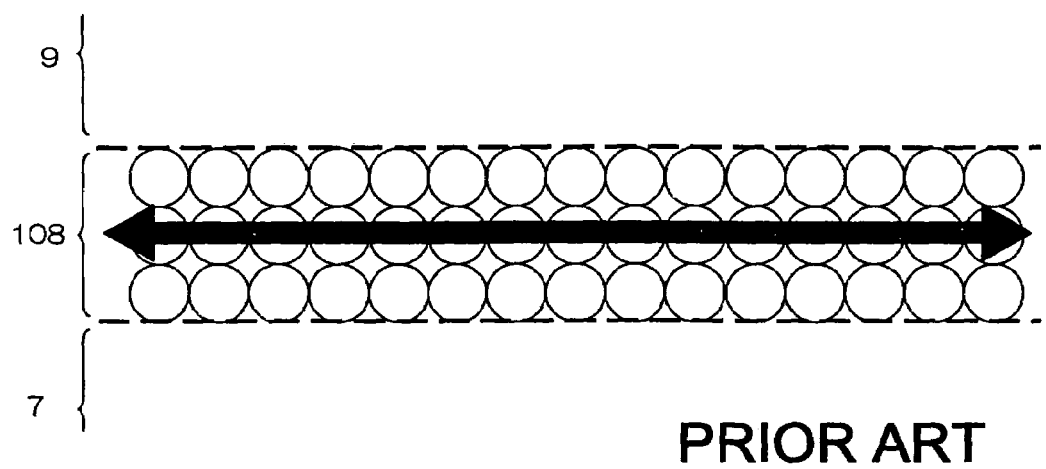
FIG. 1 is a schematic cross-sectional view of the interface between the tunnel barrier layer and the pinned layer according to a conventional art.
Figure 2:
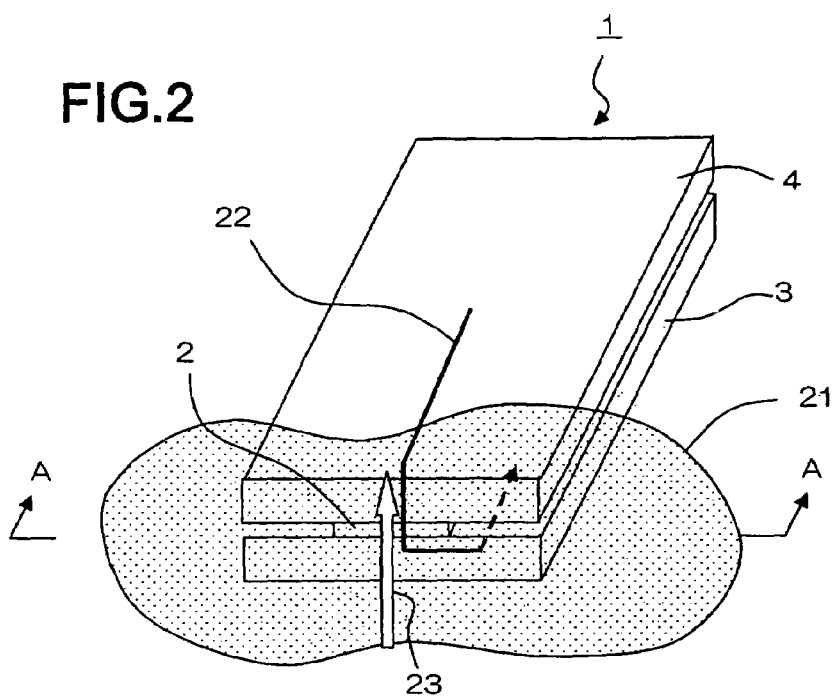
FIG. 2 is a partial perspective view of a thin film magnetic head using a magneto-resistive element of the present invention.

Explanations are given about embodiments of a magneto-resistive element (hereinafter, called TMR element) according to the present invention with reference to the drawings. As the first embodiment, a TMR element that is applied to a thin film magnetic head used for a hard disk drive is explained. FIG. 2 is a partial perspective view of thin film magnetic head that uses a magneto-resistive element of the present invention. Thin film magnetic head 1 may be a read-only head, or may be a MR/inductive combined head that further includes a write head portion. TMR element 2 is sandwiched between lower electrode 3 and upper electrode 4, and the tip portion thereof is arranged opposite to recording medium 21. Lower electrode 3 and upper electrode 4 have the function of magnetic shield layers for TMR element 2, which is the magneto-resistive element, and the function of electrodes for supplying sense current 22. Sense current 22, which is generated by a voltage that is applied to lower electrode 3 and upper electrode 4, flows from upper electrode 4 to lower electrode 3 in the direction of stacking via TMR element 2, as indicated by the arrow in FIG. 2. The magnetic field of recording medium 21 at the position that is opposite to TMR element 2 changes in accordance with the movement of recording medium 21 in direction 23. TMR element 2 detects the variation in the magnetic field as the change in electric resistance of sense current 22, which is obtained through the TMR effect, and thereby reads magnetic information that is recorded in each magnetic domain of recording medium 21.

Figure 3:
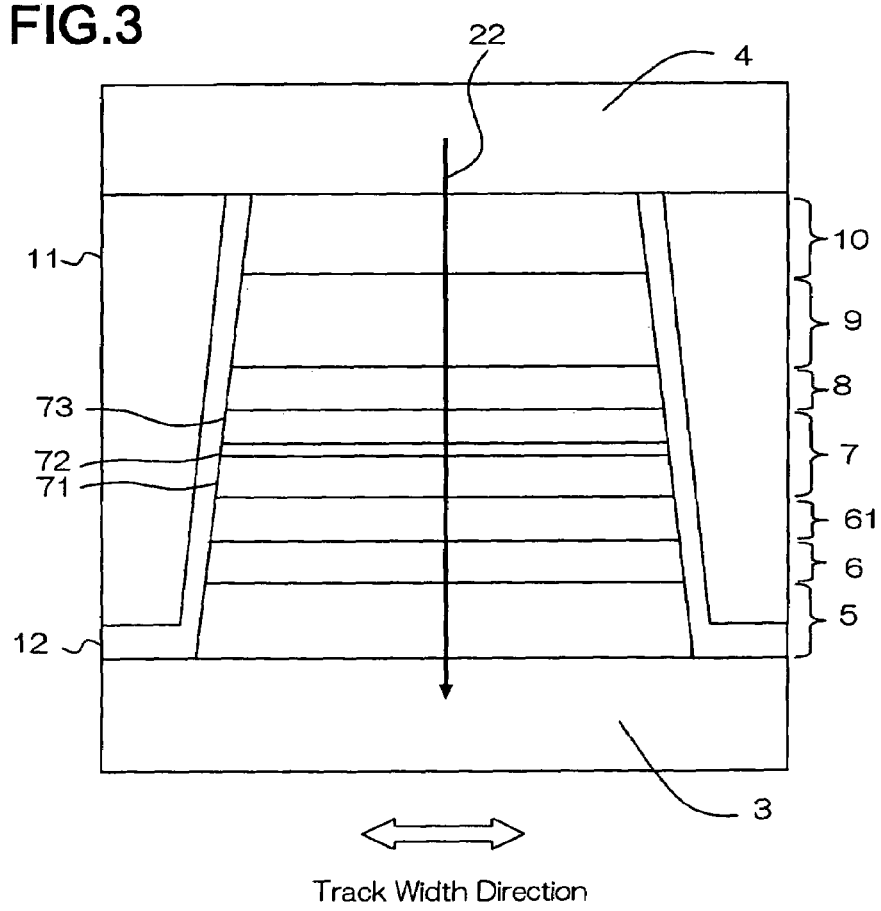
FIG. 3 is a side view of the thin film magnetic head shown in FIG. 2 viewed from the side of ABS.

FIG. 3 is a side view of a TMR element showing the arrangement of the layers viewed from direction A-A in FIG. 2 i.e., from the side of ABS. ABS is the surface of thin film magnetic head 1 that is opposite to recording medium 21.

TMR element 2 is formed by stacking lower metal layer 5, seed layer 6, antiferromagnetic layer 61, pinned layer 7, tunnel barrier layer 8, free layer 9, and cap layer 10 between lower electrode 3 and upper electrode 4 such that these layers are adjacent to each other and stacked in this order starting from lower electrode 3 to upper electrode 4. Pinned layer 7 is a lower layer whose magnetization direction is fixed relative to the external magnetic field, and free layer 9 is an upper layer whose magnetization direction varies in accordance with the external magnetic field. Tunnel barrier layer 8 is arranged between pinned layer 7 and free layer 9. The sense current, which is applied in the direction of stacking, flows beyond tunnel barrier layer 8 due to the tunneling effect, and experiences change in electric resistance thereof in accordance with the external magnetic field. In this way, the magnitude of the external magnetic field is detected, and thereby magnetic data in recording medium 21 is read by detecting the change in the electric resistance.

Next, the arrangement of the essential parts of TMR element 2 is explained in more detail. Lower electrode 3 made of perm-alloy (NiFe) is formed on a substrate made of ALTiC ($Al_2O_3.TiC$), not shown, via a seed layer made of alumina ($Al_2O_3$), not shown. Lower metal layer 5 made of, for example, Ta is formed on lower electrode 3. Seed layer 6 made of, for example, NiCr is formed on lower metal layer 5. Metal layer 5 and seed layer 6 may be formed only over TMR element 2, or over lower electrode 3.

Pinned layer 7 is disposed on seed layer 6 via antiferromagnetic layer 61. Antiferromagnetic layer 61, which may be made of Mn-alloys, such as PtMn, RuRhMn, FeMn, NiMn, PdPtMn, RhMn, or CrMnPt, in addition to IrMn, fixes the magnetization of outer pinned layer 71, as will be described later. In this embodiment, pinned layer 7 is constructed as a synthetic pinned layer, which is formed by stacking outer pinned layer 71, non-magnetic immediate layer 72, and inner pinned layer 73 in this order. The magnetization direction of inner pinned layer 73 is fixed in a predetermined direction due to antiferromagnetic coupling with outer pinned layer 71 via non-magnetic immediate layer 72. In the synthetic pinned layer, the magnetization direction of inner pinned layer 73 is securely fixed, and in addition, since the magnetic moments of outer pinned layer 71 and inner pinned layer 73 are cancelled, the total leakage of magnetic field is limited. Outer pinned layer 71 is made of, for example, CoFe. Inner pinned layer 73 is preferably made of CoFeB in this embodiment, and plasma treatment is applied to the upper surface thereof, as will be described later. Inner pinned layer 73 may also be made of a wide variety of ferromagnetic alloy materials having Fe, Co, Ni, FeCo, NiFe, FeCoNi, etc. in addition to CoFeB. Non-magnetic intermediate layer 72 is made of, for example, Ru.

Tunnel barrier layer 8 is made of MgO, and has a thickness of about 2 nm.

Free layer 9 is made of, for example, CoFeB. Free layer 9 may also be made of a wide variety of ferromagnetic alloy materials having Fe, Co, Ni, FeCo, NiFe, FeCoNi, etc. in addition to CoFeB.

Cap layer 10 is provided in order to prevent deterioration of TMR element 2. Cap layer 10 is formed, for example, by stacking a Ru layer and a Ta layer in this order. These layers are conductive in order to allow the sense current flowing from upper electrode 4 to pass through. Cap layer 10 may also made of Rh, Pd, Ag, Ir, Pt, Au, or alloys thereof.

A pair of hard magnetic layers 11 are arranged on both sides of TMR element 2 relative to the track width direction which is indicated by the white arrow in FIG. 3. Hard magnetic layers 11 apply bias magnetic field to free layer 9 in the track width direction. The magnetization direction of free layer 9 is directed in the track width direction by the bias magnetic field when no external magnetic field is applied from the recording medium. Each hard magnetic layer 11 may be formed as a single layer that is made of hard magnetic material, such as CoCrPt, or may be formed by stacking a soft magnetic layer and an antiferromagnetic layer in this order. Insulating layers 12 are provided between hard magnetic layer 11 and TMR element 12 in order to prevent bypass of the sense current via hard magnetic layer 11.

Further, a write head portion is arranged above TMR element 2, though not shown in drawings. The write head portion is covered with an overcoat layer that is made of alumina or the like.

Figure 4:
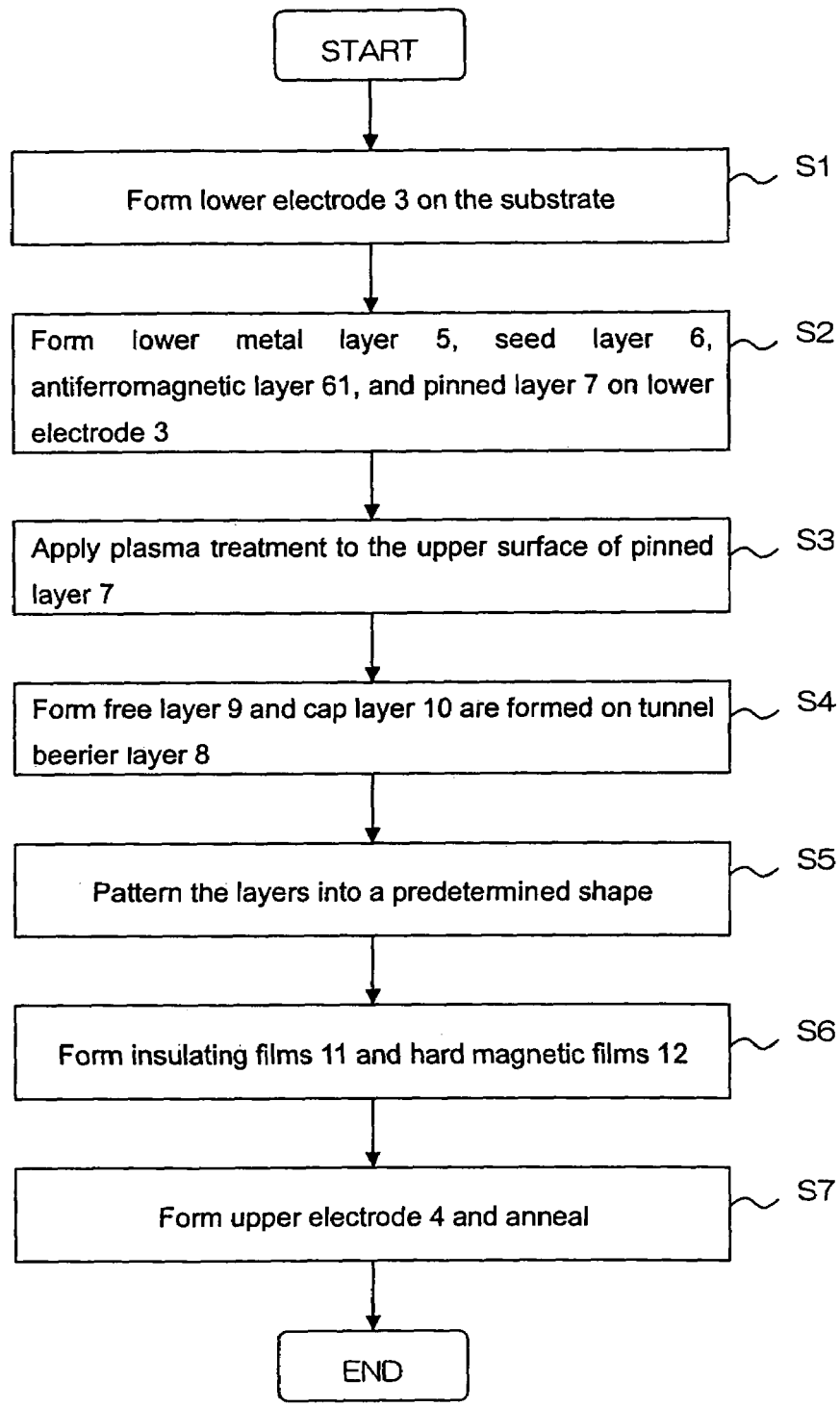
FIG. 4 is a flow chart showing a method for manufacturing the thin film magnetic head shown in FIG. 2.

Next, explanations are given about the method for manufacturing the TMR element which is explained above, with reference to the flowchart in FIG. 4. First, lower electrode 3 is formed on a substrate made of ALTiC by, for example, sputtering or plating (Step S1). Then, lower metal layer 5, seed layer 6, antiferromagnetic layer 61, and pinned layer 7 are sequentially formed on lower electrode 3 by, for example, sputtering (Step S2). Then, the upper surface of pinned layer 7 is treated using plasma treatment in an atmosphere of argon (Ar) or nitrogen (N) (Step S3). Alternatively, the upper surface may be slightly etched using ion beams. After the surface treatment to pinned layer 7, tunnel barrier layer 8 made of MgO is formed on the upper surface of pinned layer 7 by, for example, sputtering. Tunnel barrier layer 8 is formed by directly depositing MgO on pinned layer 7. Further, free layer 9 and cap layer 10 are formed on tunnel barrier layer 8 by, for example, sputtering (Step S4). Next, the layers are patterned into a predetermined shape by using a general etching method that uses a patterned resist layer, or by using a liftoff method, or by using both methods (Step S5). Then, insulating layers 12 and hard magnetic layers 11 are formed on both sides of the patterned layers by, for example, ion beam sputtering (Step S6). After that, upper electrode 4 is formed by, for example, sputtering or plating, and the layers that have been formed are annealed (Step S7). The TMR element is manufactured by the above steps. A write head portion may further be formed on upper electrode 4 in order to manufacture a thin film magnetic head having a write head portion.

Figure 5A:
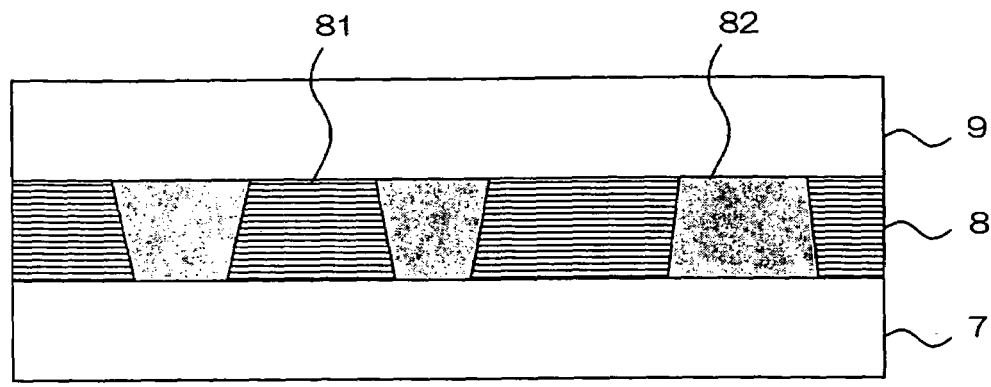
FIGS. 5A, 5B are schematic views showing the structure of the tunnel barrier layer.
Figure 5B:
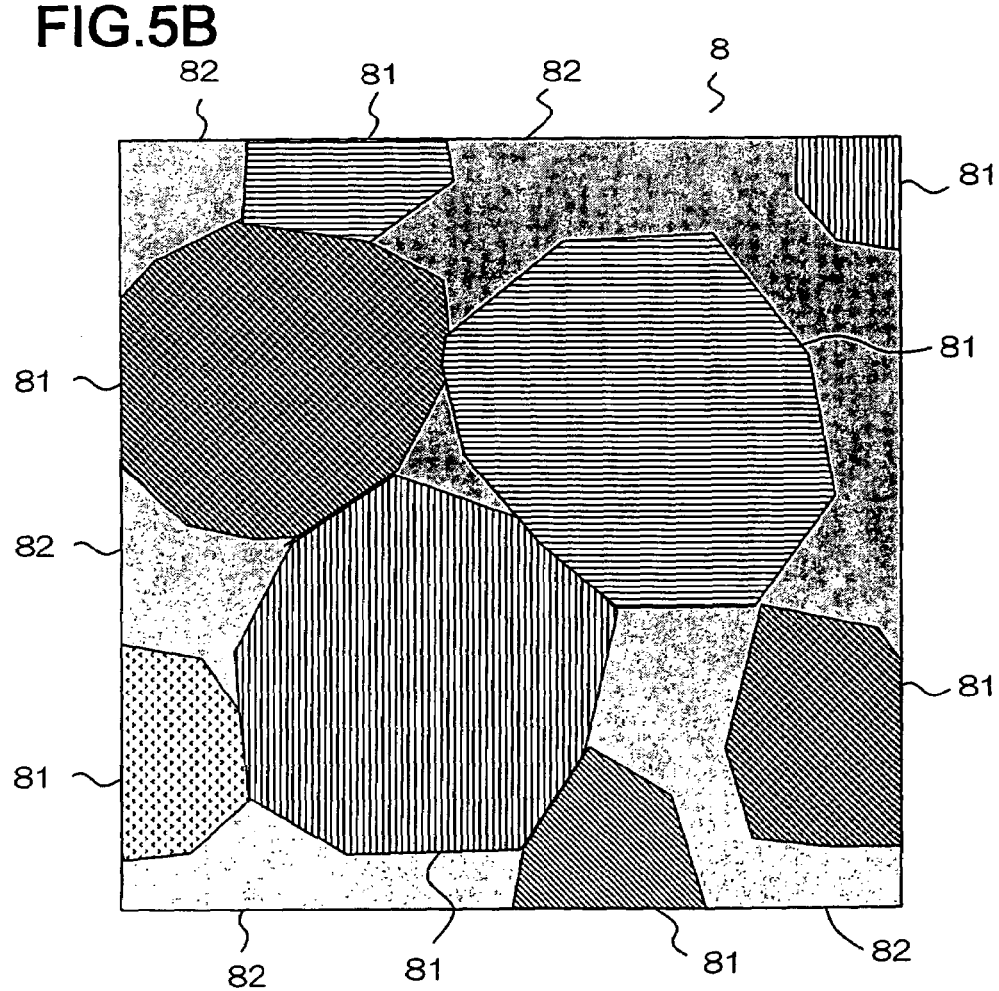

In the manufacturing steps described above, the step comprising the surface treatment, such as plasma treatment, is the characteristic part of the present invention. By virtue of this treatment, tunnel barrier layer 8, which is formed on the upper surface of pinned layer 7 that experiences the surface treatment, exhibits the structure shown in FIGS. 5A and 5B. FIGS. 5A, 5B illustrate a cross-sectional view and a plan view of tunnel barrier layer 8, respectively. As a result of observing a plurality of cross-sectional views, which are the views that can actually be observed, it is considered that crystalline portions 81 and non-crystalline portions 82 (amorphous portions) co-exist in tunnel barrier layer 8 in a plane that is parallel with the surface of tunnel barrier layer 8, as shown in FIG. 5A. The distribution of crystalline portions 81 and non-crystalline portions 82 is almost constant in the thickness direction. Crystalline portions 81, which contribute to MR ratio, penetrate tunnel barrier layer 8 in the thickness direction. Crystalline portions 81 have {100} orientation.

Figure 6:
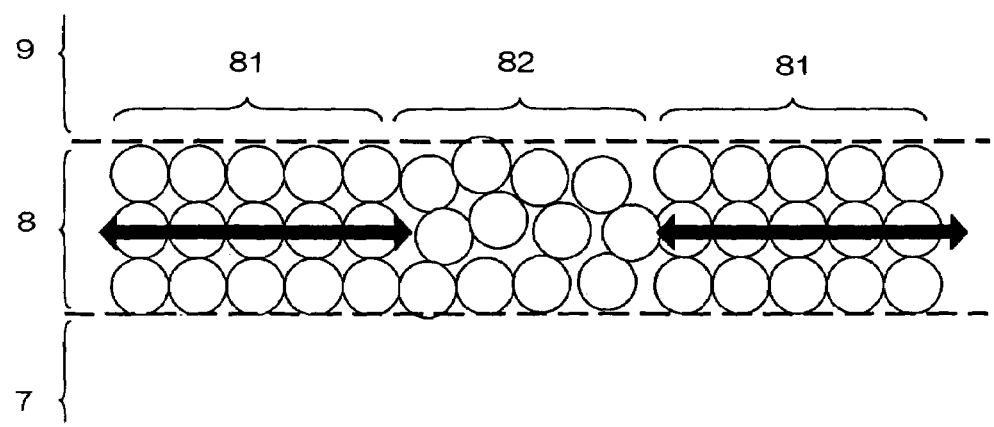
FIG. 6 is a schematic cross-sectional view of the interface between the tunnel barrier layer and the pinned layer according to the present invention.

As mentioned above, tunnel barrier layer 8 is arranged between free layer 9, which is the upper layer, and pinned layer 7, which is the lower layer. Moreover, various layers are formed outside free layer 9 and pinned layer 7. During the formation of these layers, in-plane stress is generated in the layers. For example, in-plane compressive stress is usually generated in the overcoat layer. This compressive stress is transmitted to tunnel barrier layer 8 via each layer to cause in-plane stress in tunnel barrier layer 8. However, as shown in FIG. 6, tunnel barrier layer 8 is formed such that crystalline portions 81 and non-crystalline portions 82 co-exist in a plane that is parallel with the surface of tunnel barrier layer 8, non-crystalline portions 82 absorb the stress by dislocating atoms, and internal stress is localized and limited, as illustrated by the arrows in FIG. 6. Accordingly, large in-plane stress and the resultant damage, such as small cracks, in tunnel barrier layer 8 which may be caused by the in-plane stress are effectively prevented, and the reduction in MR ratio can also be prevented. Additionally, since crystalline portions 81 are formed to penetrate tunnel barrier layer 8 in the thickness direction, the tunneling effect is kept at the same level as in a conventional element. Because of this mechanism, the damage to tunnel barrier layer 8 is prevented, and MR ratio is improved.

Although the reason why the structure shown in FIG. 5B is obtained, is not clear, the inventors basically think as follows. Specifically, by applying surface treatment to pinned layer 7 that is made of CoFeB, which is an amorphous layer and originally has a highly flat surface, the roughness of the surface is increased, and many small recesses are formed on the surface. The degree of roughness of the surface, or the size of the small recesses, is not completely identical in each portion, and the surface is divided into areas having small roughness and areas having large roughness. Since the surface of pinned layer 7 remains relatively flat in the former areas, Mg atoms and O atoms tend to be regularly arranged so that crystalline portions 81 are formed. In the latter areas, Mg atoms and O atoms are less apt to be regularly arranged because of the influence of pinned layer 7, and, as a result, non-crystalline portions 82 are formed. Therefore, the means for surface treatment is not limited to plasma treatment, and any suitable means which are able to cause roughness to the surface, such as ion beam etching mentioned above, may be used. In addition, a tunnel barrier layer in which crystalline portions and non-crystalline portions co-exist in a plane that is parallel with the surface of the tunnel barrier layer can also be formed by adding Cr, B, C, Al, Si, Ti, V or the like to MgO.

Conventionally, the anneal temperature is often set to be as high as about 350° C. or more. However, in the present invention, an anneal temperature that is too high may cause the amorphous portions that has been formed to be adversely crystallized. Therefore, anneal temperature is preferably set to be about 300° C. or less (for example, 290° C.). Use of this temperature also has the merit that a high-temperature process is not required in the process of manufacturing a TMR element and a thin film magnetic head that incorporates the TMR element. This contributes to improved reliability of the element and the head. For example, it is preferable to form the upper electrode and the lower electrode, which are arranged on both sides of the TMR element, by a material, such as NiFe, in order to use these electrodes also as a magnetic shield. However, since such a material is crystalline, each grain tends to be coarse, for example, as large as 500 nm in size under a high temperature of about 350° C., which may lead to large variation in TMR characteristic. The inventors studied the relationship between the size of the TMR element and the grain diameter of the shield layer, and found that the shield layer in which the size of the TMR element is similar to or less than the grain diameter of the shield layer has the disadvantage that the resistance value RA of the TMR element varies more. Specifically, assuming that $\lambda$=the cross-sectional area of a TMR element/average cross-sectional area of grains of the shield layer, variation (a) of RA was as good as 8.4% for the element having $\lambda$ of about 100, whereas variation (a) of RA worsened to 13.3% for the element having $\lambda$ of 0.33. According to the present invention, a large value can be ensured for $\lambda$, because the anneal temperature is set to be 300° C. or less (for example, 290° C.), as explained above. The value of $\lambda$ is preferably 10 or more. In a shield layer having $\lambda$ near 10, several grains at most are included in the cross-sectional area that is equal to that of a TMR element. Although the distribution of grains is subject to the Poisson distribution, a shield layer having small $\lambda$ exhibits an asymmetric distribution around the average value, resulting in a larger variation. Therefore, the value of $\lambda$ is preferably 10 or more, more preferably, 20 or more, and most preferably, 100 or more. According to the present invention, the variation in TMR element characteristics can be prevented.

Figure 7:
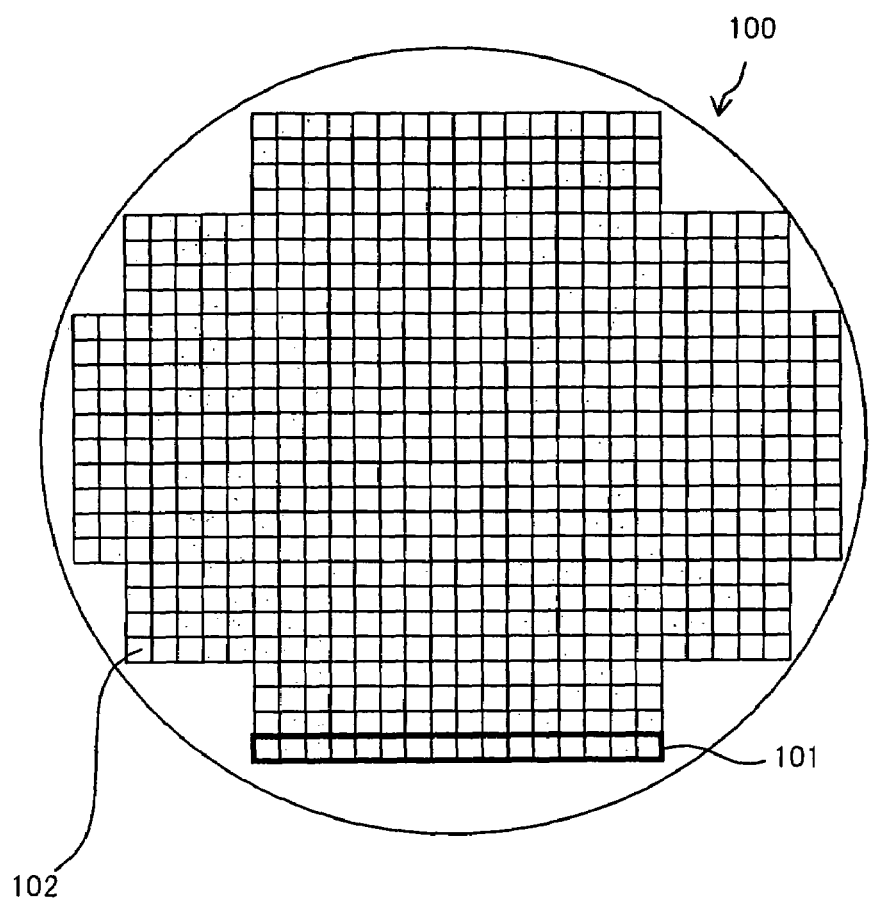
FIG. 7 is a plan view of a wafer that is used with manufacturing a stacked layer assembly according to the present invention.

Next, explanation will be made regarding a wafer for fabricating a thin-film magnetic head described above. FIG. 7 is a schematic plan view of a wafer. Wafer 100 has a plurality of thin-film magneto-electric transducers 102 which al least includes layers starting from lower shield layer 3 to upper shield layer 4. Wafer 100 is diced into bars 101, in which a plurality of thin-film magneto-electric transducers 102 are formed in a row. Bar 101 serves as a work unit in the process of forming ABS. Bar 101 is diced into the above-mentioned sliders each having a thin-film magnetic head after polishing. Spacing, not shown, is provided between transducers 102 in wafer 100 to dice wafer 100 into bars 101 and into sliders.

Figure 8:
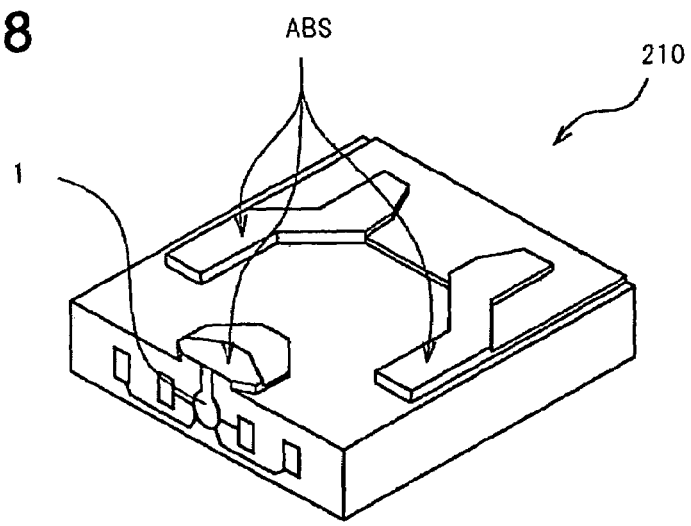
FIG. 8 is a perspective view illustrating a slider, which is included in a head gimbal assembly and which incorporates a stacked layer assembly according to the present invention.

Explanation next regards a head gimbal assembly and a hard disk drive that use the thin-film magnetic head. Referring to FIG. 8, slider 210, which is included in the head gimbal assembly, will be described first. In a hard disk drive, slider 210 is arranged opposite to a hard disk, which is a rotationally-driven disciform storage medium. Slider 210 has a substantially hexahedral form. One of the six surfaces of slider 210 forms ABS, which is positioned opposite to the hard disk. When the hard disk rotates in the z direction shown in FIG. 8, an airflow which passes between the hard disk and slider 210 creates a dynamic lift which is applied to slider 210 downward in the y direction of FIG. 8. Slider 210 is configured to lift up from the surface of the hard disk with this dynamic lift effect. In proximity to the trailing edge (the end portion at the lower left in FIG. 8) of slider 210, which is on the outlet side of the airflow, thin-film magnetic head 1 is formed.

Figure 9:
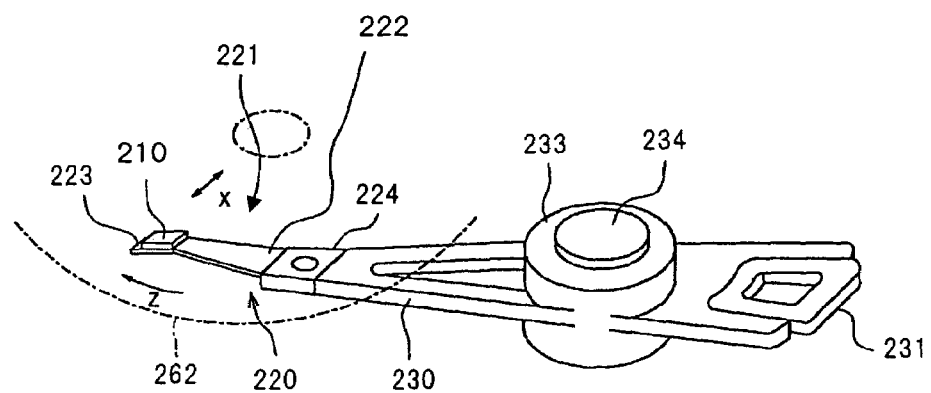
FIG. 9 is a perspective view illustrating a head arm assembly including the head gimbal assembly which incorporates a stacked layer assembly according to the present invention.

Referring to FIG. 9, head gimbal assembly 220 that has a thin-film magnetic head will be explained next. Head gimbal assembly 220 is provided with slider 210, and suspension 221 for elastically supporting slider 210. Suspension 221 has load beam 222 that is in the shape of a flat spring and is made of, for example, stainless steel. Suspension 221 also has flexure 223 that is attached to one end of load beam 222, and to which slider 210 is fixed, while providing an appropriate degree of freedom to slider 210. Suspension 221 further has base plate 224 that is provided on the other end of load beam 222. The portion of flexure 223 to which slider 210 is attached has a gimbal section for maintaining slider 210 in a fixed orientation.

The arrangement in which a head gimbal assembly 220 is attached to a single arm 230 is called a head arm assembly. Arm 230 moves slider 210 in the transverse direction x with regard to the track of hard disk 262. One end of arm 230 is attached to base plate 224. Coil 231, which constitutes a part of the voice coil motor, is attached to the other end of arm 230. In the intermediate portion of arm 230, bearing section 233 which has shaft 234 to rotatably hold arm 230 is provided. Arm 230 and the voice coil motor to drive arm 230 constitute an actuator.

Figure 10:
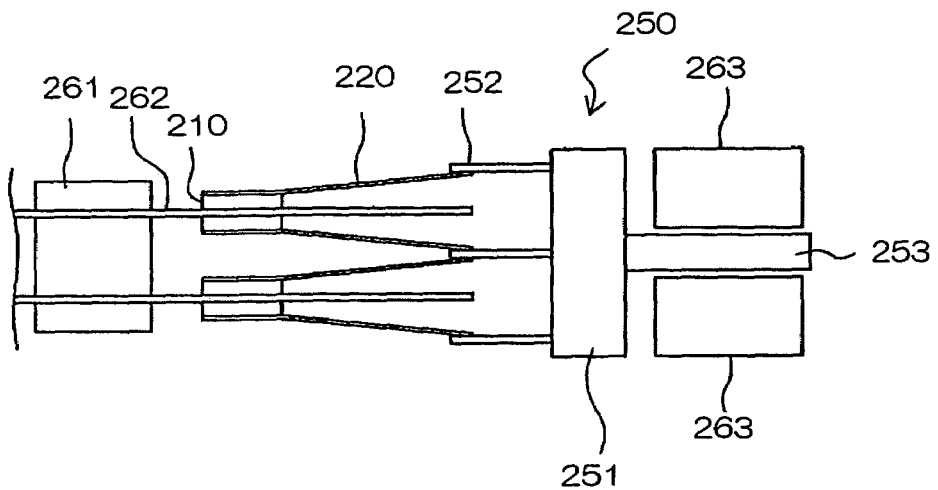
FIG. 10 is a schematic view illustrating the essential part of a hard disk drive which incorporates stacked layer assemblies according to the present invention.
Figure 11:
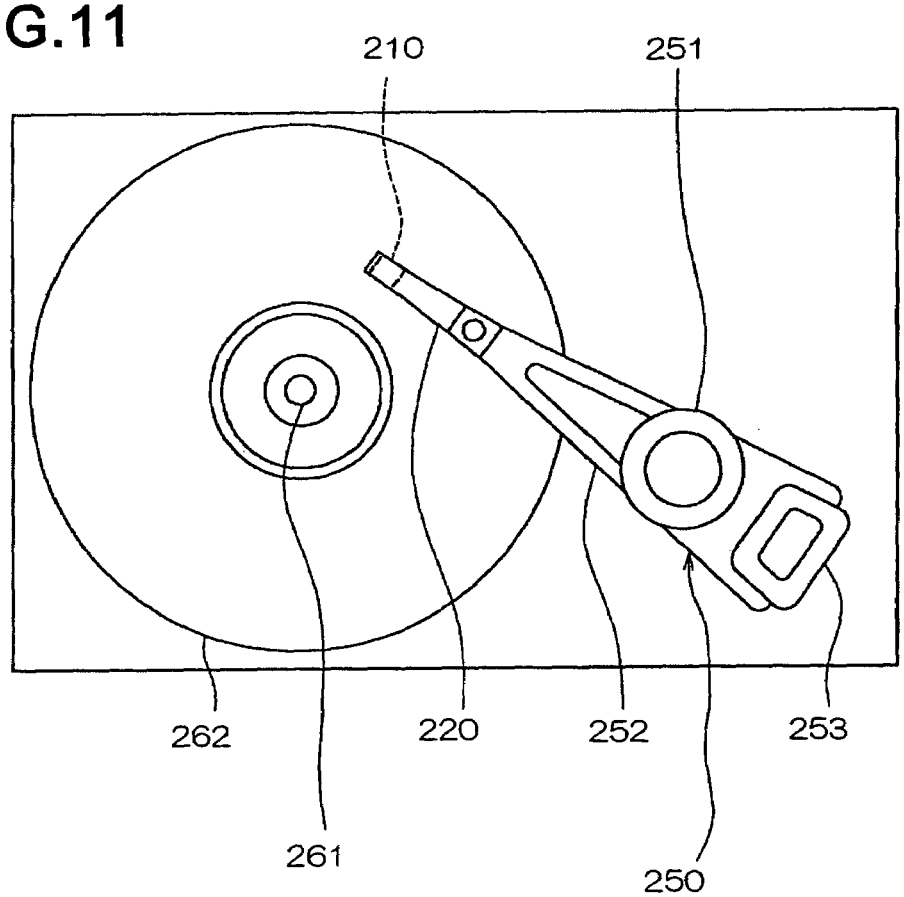
FIG. 11 is a plan view of a hard disk drive which incorporates stacked layer assemblies according to the present invention.

Referring to FIG. 10 and FIG. 11, a head stack assembly and a hard disk drive that use the thin-film magnetic head as a head element will be explained next. The arrangement in which head gimbal assemblies 220 are attached to the respective arms of a carriage having a plurality of arms is called a head stack assembly. FIG. 10 is an explanatory diagram illustrating an essential part of a hard disk drive, and FIG. 11 is a plan view of the hard disk drive. Head stack assembly 250 has carriage 251 provided with a plurality of arms 252. A plurality of head gimbal assemblies 220 are attached to a plurality of arms 252 such that head gimbal assemblies 220 are arranged apart from each other in the vertical direction. Coil 253, which constitutes a part of the voice coil, is attached to carriage 251 on the side that is opposite to arms 252. The voice coil motor has permanent magnets 263 which are arranged in positions opposite to each other interposing coil 253 of head stack assembly 250 therebetween.

Referring to FIG. 11, head stack assembly 250 is installed in the hard disk drive. The hard disk drive has a plurality of hard disks which are connected to spindle motor 261. Two sliders 210 are arranged per each hard disk 262 at positions opposite to each other interposing hard disk 262 therebetween. Head stack assembly 250 and the actuator, except for sliders 210, work as a positioning device. They carry sliders 210 and work to position sliders 210 relative to hard disks 262. Sliders 210 are moved by the actuator in the transverse direction with regard to the tracks of hard disks 262, and positioned relative to hard disks 262. Thin-film magnetic head 1 that is contained in slider 210 records information to hard disk 262 with a write head, and reads information recorded in hard disk 262 with a read head.

Figure 12:
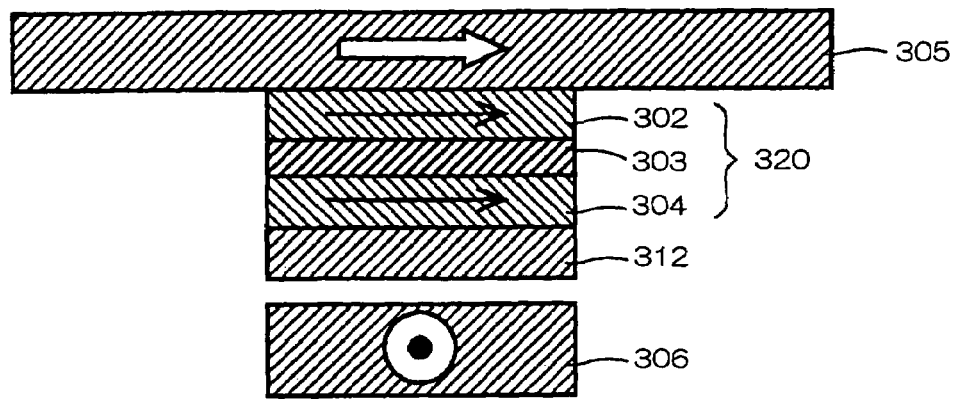
FIG. 12 is a side view showing a schematic arrangement of a MRAM.
Figure 13:
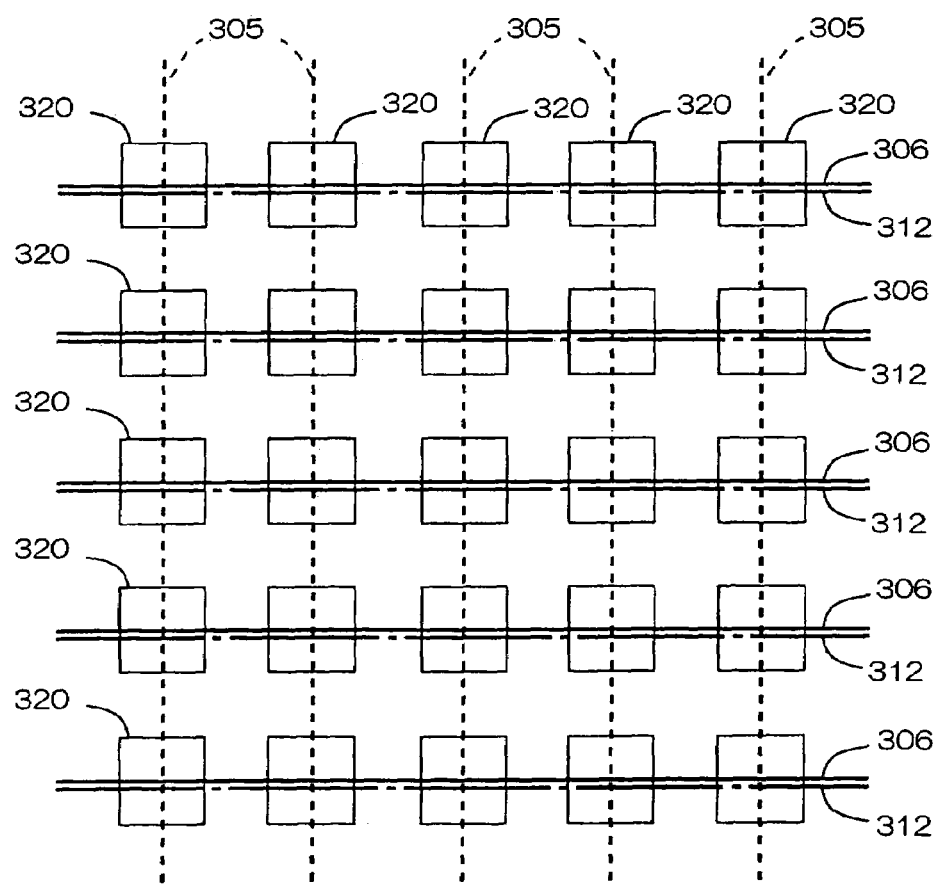
FIG. 13 is a plan view showing a schematic arrangement of a MRAM.

Next, explanations are given about an exemplary magnetic memory element (MRAM) having the above-mentioned magneto-resistive element. As shown in FIGS. 12, 13, the MRAM, which uses the tunnel magneto-resistive effect, is provided with a plurality of bit lines 305, which are arranged in parallel with each other, a plurality of write word lines 306, which are arranged in parallel with each other and orthogonal to bit lines 305, a plurality of read word lines 312, which are arranged along corresponding write word lines 306, and a plurality of TMR elements 320, which are disposed between bit lines 305 and write word lines 306 at the intersections thereof. TMR element 320 has first magnetic layer 302, tunnel barrier layer 303, and second magnetic layer 304 that works as a magnetically sensitive layer. These layers are stacked in this order, as shown in FIG. 12.

In order to store information in the MRAM using the TMR effect, current is applied to bit line 305 and write word line 306 to induce a magnetic field, which changes the magnetization direction of second magnetic layer 304 of TMR element 320 in a predetermined direction. In order to read information, current is applied to TMR element 320 in a direction that is vertical to tunnel barrier layer 303 via bit line 305 and read word line 312. The change in the electric resistance in TMR element 320 is detected.

Next, explanations are given about an exemplary magnetic sensor having the above-mentioned magneto-resistive element. FIGS. 14A to 14C are perspective views showing arrangements of a magnetic rotary encoder, a sensor assembly, and a magnetic sensor chip, respectively, which are used to detect displacement of a rotating cylinder of a camera etc.

As shown in FIG. 14A, magnetic rotary encoder 417 includes magnetic medium 417a and sensor assembly 417b. Magnetic medium 417a has a tape-shaped resin film with a magnetic layer coated thereon. Magnetic medium 417a has a lubricant coated thereon. The magnetic layer is magnetized at a predetermined pitch. Sensor assembly 417b is arranged such that magnetic sensor chip 421 is in contact with and engaged with magnetic medium 417a on the engaging surface of magnetic sensor chip 421 in order to detect the magnetic information in magnetic medium 417a.

As shown in FIG. 14B, sensor assembly 417b has suspension 420 that is formed from a metal plate, magnetic sensor chip 421 that is bonded to the surface of the tip of suspension 420 with an adhesive etc., and flexible printed circuit (FPC) member 422. FPC member 422 is bonded to suspension 420 with an adhesive etc. and has a conductive connection. FPC member 422 is bonded along the rear surface of suspension 420 and is folded at the tip of suspension 420. The tip of FPC member 422 is further bonded to the front surface of suspension 420. Connection pads that are arranged at the tip portion of FPC member 422 and electrode terminals that are formed on magnetic sensor chip 421 are electrically connected by wire bonding.

Magnetic sensor chip 421 of the present embodiment is shown in FIGS. 14B, 14C. Magnetic sensor chip 421 includes substrate 424 in an elongated rectangular parallelepiped shape and a plurality of TMR elements 425 that are formed on surface 424a of substrate 424. The number of TMR elements 425 is two in this embodiment. Lead conductors 427, as well as conductors 428 which extend in via holes, are formed on surface 424a in order to electrically connect TMR elements 425 with electrode terminals 426. Insulation layer 429 covers and protects surface 424a of substrate 424, TMR elements 425, and lead conductors 427, and allows conductors 428 to extend in the via holes. The surface of insulation layer 429 serves as engaging surface 429a, a part which is in contact with magnetic medium 417a. Electrode terminals 426 are formed on the surface of insulation layer 429. The magnetic information of an external magnetic field that is applied from magnetic medium 417a is detected by TMR elements 425, and is outputted to electrode terminals 426 via lead conductors 427 and conductors 428.

TMR elements 425 are arranged in parallel with and adjacent to each other at a predetermined interval of, for example, 20 μm, with regard to the relative moving direction of sensor assembly 417b to magnetic medium 417a, i.e., the direction of magnetization pitch of magnetic medium 417a. Each TMR element 425 is formed in a U-shaped strip that has two straight strip portions and a folded portion. The length of TMR element 425 is about 180 μm. The tip of TMR element 425 is not exposed to end surface 424b of substrate 424, and is located apart from end surface 424b by approximate 100 μm.

Substrate 424 is made of ALTiC ($Al_2O_3$—TiC), and insulation layer 429 is made of non-conductive, non-magnetic material, such as alumina ($Al_2O_3$). Electrode terminals 426, lead conductors 427, and conductors 428 are made of conductive materials, such as copper (Cu).

While the preferred embodiment of the present invention has been presented and described in detail, it should be understood that a variety of alterations and modifications can be made without departing from the spirit or scope of the appended claims.

What is claimed is:

1. A magneto-resistive element comprising a lower layer, a tunnel barrier layer, and an upper layer,
    wherein said lower layer, said tunnel barrier layer, and said upper layer are disposed adjacent to each other and are stacked in this order,
    wherein a magnetization direction of either of said lower layer and said upper layer is fixed relative to an external magnetic field, and a magnetization direction of the other layer is variable in accordance with said external magnetic field, and
    wherein a crystalline portion and a non-crystalline portion co-exist in a plane that is parallel with a surface of said tunnel barrier layer.

2. The magneto-resistive element according to claim 1, wherein said tunnel barrier layer is made of magnesium oxide.

3. A stacked layer assembly that includes the magneto-resistive element according to claim 1.

4. A wafer on which at least one thin-film magnetic transducer is formed, the thin-film magnetic transducer being used to manufacture the stacked layer assembly according to claim 3.

5. A head gimbal assembly comprising:
- a slider which has the stacked layer assembly according to claim 3, and which is configured to face a recording medium; and
- a suspension for elastically supporting the stacked layer assembly.

6. A hard disk drive comprising:
- a disk-shaped recording medium that is rotationally driven;
- a slider which has the stacked layer assembly according to claim 3, and which is arranged to face the recording medium; and
- a device for supporting the stacked layer assembly and for positioning the stacked layer assembly relative to the recording medium.

7. A magnetic sensor assembly comprising:
- a substrate which is provided with the magneto-resistive element according to claim 1; and
- a lead line which is connected to said magneto-resistive element and which outputs magnetic information of said external magnetic field, said magnetic information being detected by said magneto-resistive element.

8. A magnetic random access memory comprising:
- a plurality of magneto-resistive elements, each of which has a lower layer, a tunnel barrier layer, and an upper layer which are stacked in this order, said lower layer, said tunnel barrier layer, and said upper layer being disposed adjacent to each other; and
- a plurality of lines which are associated with said plurality of magneto-resistive elements, said lines being configured to selectively write information to one of said magneto-resistive elements, and to selectively read information from one of said magneto-resistive elements,
- wherein a magnetization direction of either of said lower layer and said upper layer is fixed relative to a magnetic field, and a magnetization direction of the other layer is variable in accordance with said magnetic field, wherein said magnetic field is applied from said lines to write information to the selected magneto-resistive element, and
- wherein a crystalline portion and a non-crystalline portion co-exist in a plane that is parallel with a surface of said tunnel barrier layer.

* * * * *